(12) United States Patent
Li et al.

(10) Patent No.: US 11,239,303 B2
(45) Date of Patent: Feb. 1, 2022

(54) DISPLAY SUBSTRATE, DISPLAY APPARATUS, AND METHOD OF FABRICATING DISPLAY SUBSTRATE

(71) Applicants: Beijing BOE Technology Development Co., Ltd., Beijing (CN); BOE Technology Group Co., Ltd., Beijing (CN)

(72) Inventors: Xinguo Li, Beijing (CN); Yongda Ma, Beijing (CN); Xueguang Hao, Beijing (CN); Xinyin Wu, Beijing (CN); Yong Qiao, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 100 days.

(21) Appl. No.: 16/631,447

(22) PCT Filed: Jun. 25, 2019

(86) PCT No.: PCT/CN2019/092745
§ 371 (c)(1),
(2) Date: Jan. 15, 2020

(87) PCT Pub. No.: WO2020/107880
PCT Pub. Date: Jun. 4, 2020

(65) Prior Publication Data
US 2021/0074791 A1 Mar. 11, 2021

(30) Foreign Application Priority Data
Nov. 26, 2018 (CN) .......................... 201821951977.1

(51) Int. Cl.
*H01L 27/32* (2006.01)
*G02F 1/1333* (2006.01)
(Continued)

(52) U.S. Cl.
CPC ........ *H01L 27/3276* (2013.01); *G02F 1/1368* (2013.01); *G02F 1/133305* (2013.01);
(Continued)

(58) Field of Classification Search
CPC .................................................. H01L 27/3276
See application file for complete search history.

(56) References Cited

U.S. PATENT DOCUMENTS

2006/0181218 A1  8/2006  Jung et al.
2017/0170206 A1  6/2017  Lee et al.
(Continued)

FOREIGN PATENT DOCUMENTS

CN   107092400 A   8/2017
CN   107342299 A   11/2017
(Continued)

OTHER PUBLICATIONS

International Search Report & Written Opinion dated Oct. 8, 2019, regarding PCT/CN2019/092745.
(Continued)

*Primary Examiner* — Douglas M Menz
(74) *Attorney, Agent, or Firm* — Intellectual Valley Law, P.C.

(57) ABSTRACT

A display substrate having a display area and a peripheral area is provided. The display substrate in the peripheral area includes a flexible base substrate; a first insulating layer on the flexible base substrate; a first signal line layer including a plurality of first signal lines on a side of the first insulating layer away from the flexible base substrate; and a second insulating layer on a side of the first signal line layer away from the flexible base substrate. The display substrate has a plurality of first vias extending through a respective one of the plurality of first signal lines, exposing a first surface of the first insulating layer; and the second insulating layer
(Continued)

extends through the plurality of first vias to be in direct contact with the first surface of the first insulating layer.

18 Claims, 6 Drawing Sheets

(51) Int. Cl.
G02F 1/1362 (2006.01)
G02F 1/1368 (2006.01)
H01L 51/00 (2006.01)
H01L 51/56 (2006.01)

(52) U.S. Cl.
CPC .... *G02F 1/136286* (2013.01); *H01L 51/0097* (2013.01); *H01L 51/56* (2013.01); *H01L 2227/323* (2013.01); *H01L 2251/5338* (2013.01)

(56) References Cited

U.S. PATENT DOCUMENTS

| | | | |
|---|---|---|---|
| 2017/0352717 A1* | 12/2017 | Choi | H01L 51/0097 |
| 2019/0067332 A1 | 2/2019 | Liu et al. | |
| 2020/0089281 A1 | 3/2020 | Ma et al. | |

FOREIGN PATENT DOCUMENTS

| | | |
|---|---|---|
| CN | 108649035 A | 10/2018 |
| CN | 108831909 A | 11/2018 |
| CN | 208077535 U | 11/2018 |

OTHER PUBLICATIONS

First Office Action in the Taiwan Patent Application No. 108120271, dated Mar. 30, 2020; English translation attached.

* cited by examiner

US 11,239,303 B2

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2019/092745, filed Jun. 25, 2019, which claims priority to Chinese Patent Application No. 201821951977.1, filed Nov. 26, 2018. Each of the forgoing applications is herein incorporated by reference in its entirety for all purposes.

TECHNICAL FIELD

The present invention relates to display technology, more particularly, to a display substrate, a display apparatus, and a method of fabricating a display substrate.

BACKGROUND

The flexible display technology is widely used due to its various advantages including lightness of a flexible display panel, good shock and vibration resistances of a flexible display panel.

SUMMARY

In one aspect, the present invention provides a display substrate having a display area and a peripheral area, wherein the display substrate in the peripheral area comprises a flexible base substrate; a first insulating layer on the flexible base substrate; a first signal line layer comprising a plurality of first signal lines on a side of the first insulating layer away from the flexible base substrate; and a second insulating layer on a side of the first signal line layer away from the flexible base substrate; wherein the display substrate has a plurality of first vias extending through a respective one of the plurality of first signal lines, exposing a first surface of the first insulating layer; and the second insulating layer extends through the plurality of first vias to be in direct contact with the first surface of the first insulating layer.

Optionally, the display substrate in, the peripheral area further comprises a second signal line layer comprising a plurality of second signal lines on a side of the second insulating layer away from the first insulating layer; and a third insulating layer on a side of the second signal line layer away from the flexible base substrate; wherein the display substrate has a plurality of second vias extending through a respective one of the plurality of second signal lines, exposing a second surface of the second insulating layer; and the third insulating layer extends through the plurality of second vias to be in direct contact with the second surface of the second insulating layer.

Optionally, an orthographic projection of the respective one of the plurality of first signal lines on the flexible base substrate is substantially non-overlapping with orthographic projections of the plurality of second signal lines on the flexible base substrate; and an orthographic projection of the respective one of the plurality of second signal lines on the flexible base substrate is substantially non-overlapping with orthographic projections of the plurality of first signal lines on the flexible base substrate.

Optionally, orthographic projections of the plurality of first signal lines on the flexible base substrate and orthographic projections of the plurality of second signal lines on the flexible base substrate are alternately arranged.

Optionally, the plurality of first signal lines and the plurality of second signal lines extend along a direction from the display area to the peripheral area.

Optionally, the respective one of the plurality of first signal lines and the respective one of the plurality of second signal lines have a curved configuration in plan view of the display substrate.

Optionally, the curved configuration is an undulation configuration.

Optionally, a first width of the respective one of the plurality of first signal lines along a cross-section perpendicular to an extension direction of the respective one of the plurality of first signal lines is substantially uniform; and a second width of the respective one of the plurality of second signal lines along a cross-section perpendicular to an extension direction of the respective one of the plurality of second signal lines is substantially uniform.

Optionally, a center point of a respective one of the plurality of first vias extending through the respective one of the plurality of first signal lines is substantially equidistant with respect to two opposite edges of the respective one of the plurality of first signal lines across a width of the respective one of the plurality of first signal lines; and a center point of a respective one of the plurality of second vias extending through the respective one of the plurality of second signal lines is substantially equidistant with respect to two opposite edges of the respective one of the plurality of second signal lines across a width of the respective one of the plurality of second signal lines.

Optionally, a respective one of the plurality of first vias has a first diameter on a side away from the flexible base substrate and a second diameter on a side closer to the flexible base substrate, the first diameter being greater than the second diameter; and a respective one of the plurality of second vias has a third diameter on a side away from the flexible base substrate and a fourth diameter on a side closer to the flexible base substrate, the third diameter being greater than the fourth diameter.

Optionally, the respective one of the plurality of first vias has a truncated cone shape, and the respective one of the plurality of second vias has a truncated cone shape.

Optionally, a first included angle between a lateral side of the respective one of the plurality of first vias and the flexible base substrate is in a range of 15 degrees to 85 degrees; and a second included angle between a lateral side of the respective one of the plurality of second vias and the flexible base substrate is in a range of 15 degrees to 85 degrees.

Optionally, a first portion of the second insulating layer extending into a respective one of the plurality of first vias has a first diameter on a side away from the flexible base substrate and a second diameter on a side closer to the flexible base substrate, the first diameter being greater than the second diameter; and a second portion of the third insulating layer extending into a respective one of the plurality of second vias has a third diameter on a side away from the flexible base substrate and a fourth diameter on a side closer to the flexible base substrate, the third diameter being greater than the fourth diameter.

Optionally, a first portion of the second insulating layer extending into a respective one of the plurality of first vias is in direct contact with the respective one of the plurality of first signal lines along a lateral side of the respective one of the plurality of first vias; and a second portion of the third insulating layer extending into a respective one of the plurality of second vias is in direct contact with the respective one of the plurality of second signal lines along a lateral side of the respective one of the plurality of second vias.

Optionally, the display substrate further comprises a plurality of thin film transistors in the display area for driving image display of the display substrate; wherein the peripheral area comprises a fan-out area; at least a portion of the peripheral area being a bendable area; and the bendable area is within the fan-out area.

Optionally, the fan-out area is between the display area and a bonding area for bonding a connection terminal.

Optionally, at least a portion of the peripheral area being a bendable area; and the display substrate in the bendable area comprises: the flexible base substrate; the first insulating layer on the flexible base substrate; the first signal line layer comprising the plurality of first signal lines on a side of the first insulating layer away from the flexible base substrate; and the second insulating layer on a side of the first signal line layer away from the flexible base substrate; wherein the display substrate has a plurality of first vias extending through a respective one of the plurality of first signal lines, exposing a first surface of the first insulating layer; and the second insulating layer extends through the plurality of first vias to be in direct contact with the first surface of the first insulating layer.

In another aspect, the present invention provides a display apparatus, comprising the display substrate described herein or fabricated by a method described herein.

In another aspect, the present invention provides a method of fabricating a display substrate having a display area and a peripheral area, comprising, in the peripheral area, forming a first insulating layer on a flexible base substrate; forming a first signal line layer on a side of the first insulating layer away from the flexible base substrate, the first signal line layer formed to comprise a plurality of first signal lines; forming a plurality of first vias extending through a respective one of the plurality of first signal lines, exposing a first surface of the first insulating layer; and forming a second insulating layer on a side of the first signal line layer away from the flexible base substrate, the second insulating layer formed to extend through the plurality of first vias to be in direct contact with the first surface of the first insulating layer.

Optionally, the method further comprises, in the peripheral area, forming a second signal line layer on a side of the second insulating layer away from the first insulating layer, the second signal line layer formed to comprise a plurality of second signal lines; forming a plurality of second vias extending through a respective one of the plurality of second signal lines, exposing a second surface of the second insulating layer; and forming a third insulating layer on a side of the second signal line layer away from the flexible base substrate, the third insulating layer formed to extend through the plurality of second vias to be in direct contact with the second surface of the second insulating layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

A flexible display substrate is frequently bended by the user. Usually, signal lines are disposed in the bendable area of the flexible display substrate, the signal lines and the insulating layers in direct contact with the signal lines may be separated due to the repeatedly bending movements by the user. After a signal line is separated from an insulating layer, force applied on the different portions of the signal line are not even, which may cause breakages on the signal line, leading to electrical shorts of the signal line and damages on the display substrate.

Especially in the bendable area of a display substrate, the signal lines are concentratedly disposed in the bendable area. It is more likely that the signal lines in the bendable area breaks due to the bendable area being repeatedly bended.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate having a display area and a peripheral area. Optionally, the display substrate in the peripheral area includes a flexible base substrate; a first insulating layer on the flexible base substrate; a first signal line layer including a plurality of first signal lines on a side of the first insulating layer away from the flexible base substrate; and a second insulating layer on a side of the first signal line layer away from the flexible base substrate. Optionally, the display substrate has a plurality of first vias extending through a respective one of the plurality of first signal lines to expose a first surface of the first insulating layer. Optionally, the second insulating layer extends through the plurality of first vias to be in direct contact with the first surface of the first insulating layer.

Figure 1:
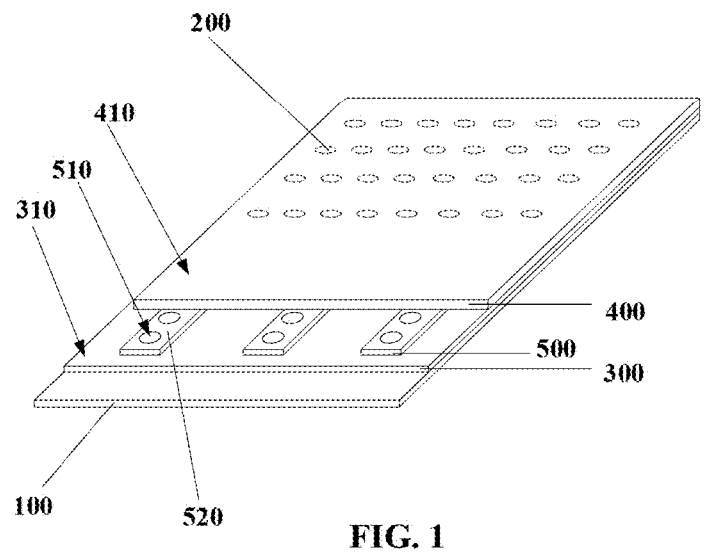
FIG. 1 is a schematic diagram illustrating a structure of a display substrate in some embodiments according to the present disclosure.
Figure 2:
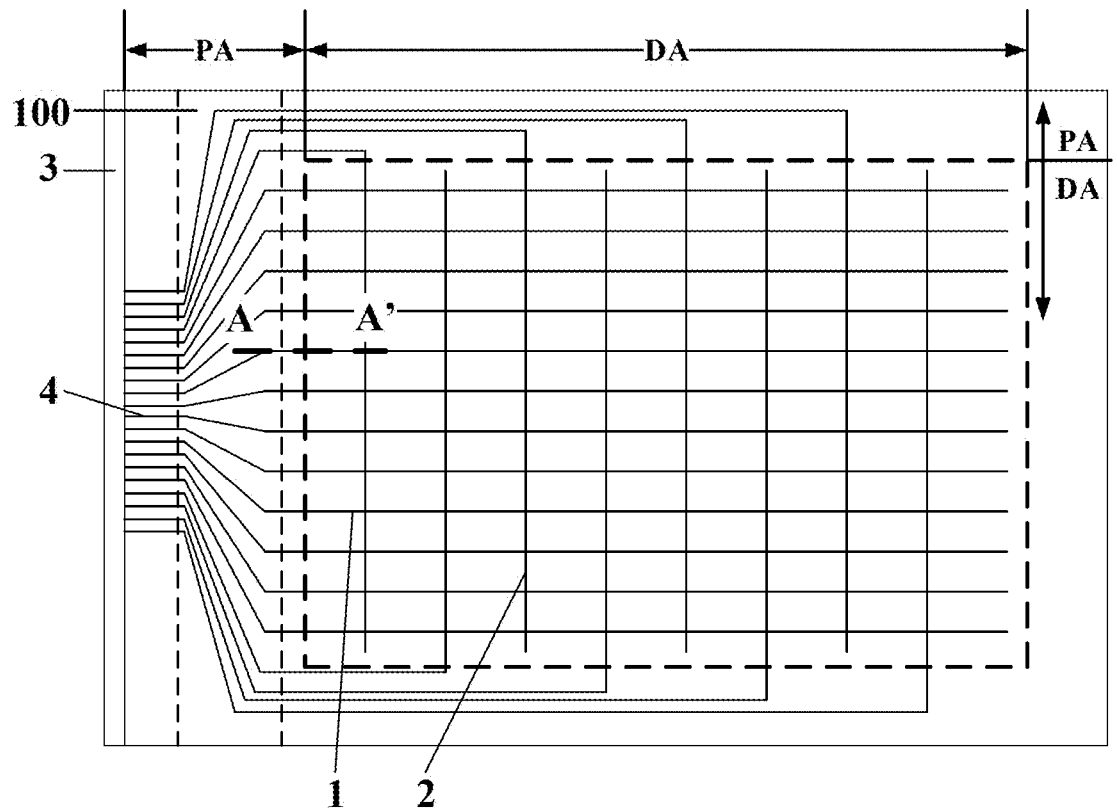
FIG. 2 is a plan view of a display substrate in some embodiments according to the present disclosure.
Figure 3:
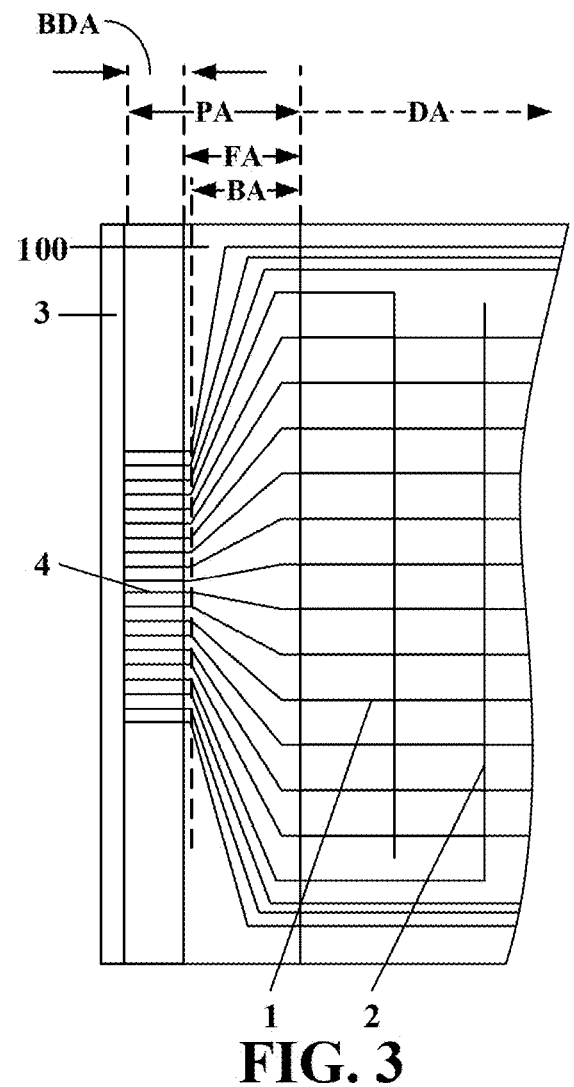
FIG. 3 is a partial plan view of a display substrate in some embodiments according to the present disclosure.

FIG. 1 is a schematic diagram illustrating a structure of a display substrate in some embodiments according to the present disclosure. FIG. 2 is a plan view of a display substrate in some embodiments according to the present disclosure. FIG. 3 is a partial plan view of a display substrate in some embodiments according to the present disclosure. Referring to FIG. 1, FIG. 2, and FIG. 3, in some embodiments, a display substrate has a display area DA and a peripheral area PA.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding to a pixel definition layer in an organic light emitting diode display panel. Optionally, the inter-subpixel region, is a region between adjacent subpixel regions in a same pixel. Optionally, the inter-subpixel region is a region between two adjacent subpixel regions from two adjacent pixels. As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

Referring to FIG. 2, in some embodiments, in the display area DA, a plurality of gate lines 1 and a plurality of data lines 2 are formed on a side of the flexible base substrate 100. Optionally, the plurality of gate lines 1 extends in a direction perpendicular to an extension direction of the plurality of data lines 2.

In some embodiments, the display substrate includes a flexible base substrate 100, a plurality of thin film transistors 200 on a side of the flexible base substrate 100. Optionally, the plurality of thin film transistors 200 is in the display area for driving image display of the display substrate.

Referring to both FIG. 2, and FIG. 3, in some embodiments, at least a portion of the peripheral area PA is a bendable area BA. Optionally, the peripheral area PA includes a fan-out area. FA. Optionally, the bendable area BA is within the fan-out area FA.

In some embodiments, the peripheral area. PA includes a bonding area. BDA. Optionally, the fan-out area FA is between the display area DA and a bonding area BDA for bonding the connection terminal 3. Optionally, the bendable area BA is between the display area DA and a bonding area BDA.

In some embodiments, a connection terminal 3 is disposed on an edge of the flexible base substrate 100. Optionally, the bonding area BDA bonds the connection terminal 3 with the fan-out area FA. Optionally, a plurality of lead wires 4 are on the flexible base substrate 100 in the bonding area BDA. In one example, a respective one of the plurality of lead wires connects a respective one of the plurality of gate lines 1 with the connection terminal 3. In another example, a respective one of the plurality of lead wires 4 connects a respective one of the plurality of data lines 2 with the connection terminal 3.

Figure 4:
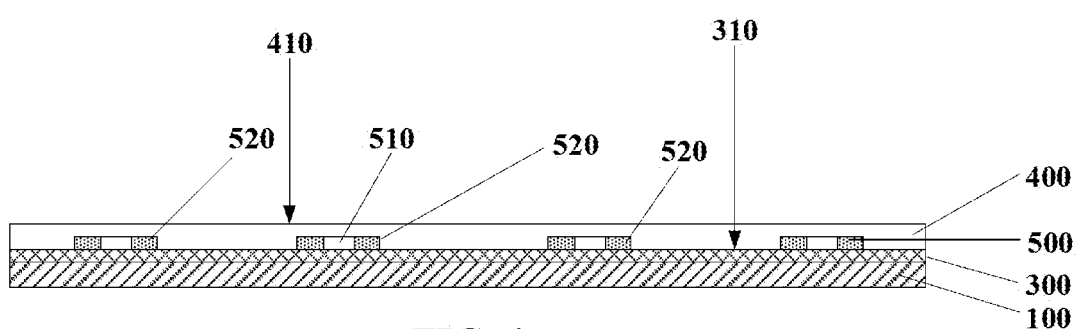
FIG. 4 is a partial cross-sectional view of a display substrate in some embodiments according to the present disclosure.

FIG. 4 is a partial cross-sectional view of a display substrate in some embodiments according to the present disclosure. Referring to FIG. 1, FIG. 3, and FIG. 4, in some embodiments, the display substrate in the peripheral area PA includes the flexible base substrate 100, a first insulating layer 300 on the flexible base substrate 100, a first signal line layer 500 including a plurality of first signal lines 520 on a side of the first insulating layer 300 away from the flexible base substrate 100, and a second insulating layer 400 on a side of the first signal line layer 500 away from the flexible base substrate 100.

Optionally, the first insulating layer 300, the first signal line layer 500, and the second insulating layer 400 are sequentially formed on the flexible base substrate 100. For example, the first signal line layer 500 is between the first insulating layer 300 and the second insulating layer 400.

In some embodiments, the display substrate has a plurality of first vias 510 extending through a respective one of the plurality of first signal lines 520 to expose a first surface 310 of the first insulating layer 300. For example, the first surface 310 of the first insulating layer 300 is a side of the first insulating layer 300 away from the flexible base substrate 100. Optionally, the second insulating layer 400 extends through the plurality of first vias 510 to be in direct contact with the first surface 310 of the first insulating layer 300.

By forming the first signal line layer 500 between the first insulating layer 300 and the second insulating layer 400, and forming a plurality of first vias 510 extending through a respective one of the plurality of first signal lines 520, the second insulating layer 400 can be in direct contact with the first insulating layer 300 through the plurality of first vias 510, which may increase both an adhesion between the first insulating layer 300 and the first signal line layer 500, and an adhesion between the second insulating layer 400 and the first signal line layer 500. So, it is difficult for the first signal line layer 500 to be separated from the first insulating layer 300, and be separated from the second insulating layer 400.

Figure 5:
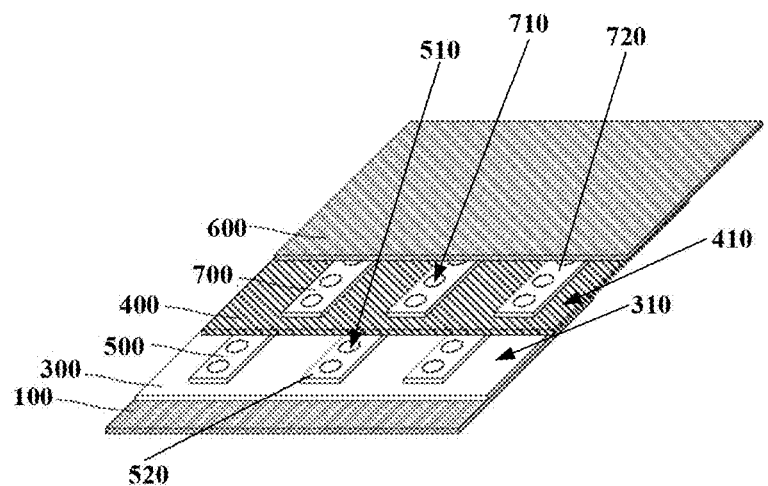
FIG. 5 is a schematic diagram illustrating a structure of a display substrate in some embodiments according to the present disclosure.

FIG. 5 is a schematic diagram illustrating a structure of a display substrate in some embodiments according to the present disclosure. Referring to FIG. 5, in some embodiments, the display substrate in the peripheral area PA includes a flexible base substrate 100, a first insulating layer 300 on the flexible base substrate 100, a first signal line layer 500 including a plurality of first signal lines 520 on a side of the first insulating layer 300 away from the flexible base substrate 100, a second insulating layer 400 on a side of the first signal line layer 500 away from the flexible base substrate 100, a second signal line layer 700 including a plurality of second signal lines 720 on a side of the second insulating layer 400 away from the first insulating layer 300, and a third insulating layer 600 on a side of the second signal line layer 700 away from the flexible base substrate 100.

Optionally, the first insulating layer 300, the first signal line layer 500, and the second insulating layer 400, the second signal line layer 700, and the third insulating layer 600 are sequentially formed on the flexible base substrate 100. The first signal line layer 500 is between the first insulating layer 300 and the second insulating layer 400. The second signal line layer 700 is between the second insulating layer 400 and the third insulating layer 600.

In some embodiments, the display substrate has a plurality of first vias 510 extending through a respective one of the plurality of first signal lines 520 to expose the first surface 310 of the first insulating layer 300. For example, the first surface 310 of the first insulating layer 300 is a side of the first insulating layer 300 away from the flexible base substrate 100. Optionally, the second insulating layer 400 extends through the plurality of first vias 510 to be in direct contact with the first surface 310 of the first insulating layer 300.

In some embodiments, the display substrate further has a plurality of second vias 710 extending through a respective one of the plurality of second signal lines 720 to expose a second surface 410 of the second insulating layer 400. For example, the second surface 410 of the second insulating layer 400 is a side of the second insulating layer 400 away from the flexible base substrate 100. Optionally, the third insulating layer 600 extends through the plurality of second vias 710 to be in direct contact with the second surface 410 of the second insulating layer 400.

By forming the first signal line layer 500 between the first insulating layer 300 and the second insulating layer 400, and forming a plurality of first vias 510 extending through a respective one of the plurality of first signal lines 520, the second insulating layer 400 can be in direct contact with the first insulating layer 300 through the plurality of first vias 510, which may increase both an adhesion between the first insulating layer 300 and the first signal line layer 500, and an adhesion between the second insulating layer 400 and the first signal line layer 500. So, it is difficult for the first signal line layer 500 to be separated from the first insulating layer 300, and be separated from the second insulating layer 400.

By forming the second signal line layer 700 between the second insulating layer 400 and the third insulating layer 600, and forming a plurality of second vias 710 extending through a respective one of the plurality of second signal lines 720, the third insulating layer 600 can be in direct contact with the second insulating layer 400 through the plurality of second vias 710, which may increase both an adhesion between the second insulating layer 400 and the second signal line layer 700, and an adhesion between the third insulating layer 600 and the second signal line layer 700. So, it is difficult for the second signal line layer 700 to be separated from the second insulating layer 400, and be separated from the third insulating layer 600.

In some embodiments, an orthographic projection of the respective one of the plurality of first signal lines 520 on the flexible base substrate 100 is substantially non-overlapping with orthographic projections of the plurality of second signal lines 720 on the flexible base substrate 100. In some embodiments, an orthographic projection of the respective one of the plurality of second signal lines 720 on the flexible base substrate 100 is substantially non-overlapping with orthographic projections of the plurality of first signal lines 520 on the flexible base substrate 100. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping. Optionally, the orthographic projection of the respective one of the plurality of first signal lines 520 on the flexible base substrate 100 is completely non-overlapping with orthographic projections of the plurality of second signal lines 720 on the flexible base substrate 100. Optionally, the orthographic projection of the respective one of the plurality of second signal lines 720 on the flexible base substrate 100 is completely non-overlapping with the orthographic projections of the plurality of first signal lines 520 on the flexible base substrate 100.

In some embodiments, the orthographic projections of the plurality of first signal lines 520 on the flexible base substrate 100 and the orthographic projections of the plurality of second signal lines 720 on the flexible base substrate 100 are alternately arranged, which may reduce the chance of forming electrical short between signal lines.

In some embodiments, the first signal line layer 500 and the second signal line layer 700 are in different layers. For example, the first signal line layer 500 is on a side of the first insulating layer 300 away from the flexible base substrate 100. The second signal line layer 700 is on a side of the second insulating layer 400 away from the flexible base substrate 100.

Referring to FIG. 2, in some embodiments, the bendable area BA is within the fan-out area FA, and the fan-out area FA is between the display area DA and the connection terminal 3.

In some embodiments, a respective one of the plurality of lead wires 4 connects a respective one of the plurality of gate lines 1 with the connection terminal 3. In some embodiments, a respective one of the plurality of lead wires 4 connects a respective one of the plurality of data lines 2 with the connection terminal 3.

In some embodiments, the plurality of lead wires 4 includes a plurality of gate line lead wires, and a plurality of data line lead wires. In one example, a respective one of the plurality of first signal lines 520 is a portion of lead wires selected from one of the plurality of gate line lead wires and one of the plurality of data line lead wires. In another example, a respective one of the plurality of second signal lines 720 is a portion of lead wires selected from one of the plurality of gate line lead wires and one of the plurality of data line lead wires.

For example, a respective one of the plurality of first signal lines 520 is a portion of a respective one of the plurality of gate line lead wires, a respective one of the plurality of second signal lines 720 is a portion of a respective one of the plurality of data line lead wires. For example, a respective one of the plurality of first signal lines 520 is a portion of a respective one of the plurality of data line lead wires, a respective one of the plurality of second signal lines 720 is a portion of a respective one of the plurality of gate line lead wires. For example, a respective one of the plurality of first signal lines 520 a respective one of the plurality of second signal lines 720 are both portions of two different lead wires of the plurality of gate line lead wires. For example, a respective one of the plurality of first signal lines 520 and a respective one of the plurality of second signal lines 720 are both portions of two different lead wires of the plurality of data line lead wires.

In some embodiments, some of the plurality of gate line lead wires and some of the plurality of data line lead wires are at a same layer. Two adjacent lead wires of the some of the plurality of gate line lead wires and the some of the plurality of data line lead wires at the same layer are space apart.

In some embodiments, the plurality of gate line lead wires are in a layer different from a layer having the plurality of data line lead wires. Optionally, the orthographic projections of the plurality of gate line lead wires on the flexible base substrate 100 and the orthographic projection of the plurality of data line lead wires on the flexible base substrate 100 are alternatively arranged.

Figure 6:
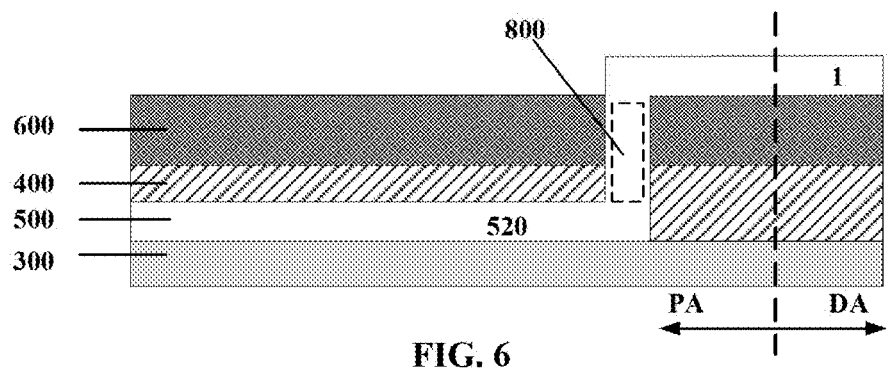
FIG. 6 is a partial cross-sectional view of a display substrate a long AA' direction in FIG. 2.

FIG. 6 is a partial cross-sectional view of a display substrate a long AA' direction in FIG. 2. Referring to FIG. 2 and FIG. 6, the plurality of first signal lines 520 and the plurality of second signal lines 720 extend along a direction from the display area DA to the peripheral area PA. Optionally, the plurality of first signal lines 520 and the plurality of second signal lines 720 extend from peripheral area PA to the display area DA through a plurality of third vias 800. For example, a respective one of the plurality of gate lines 1 is connected with a respective one of the plurality of first signal lines 520 extending from the peripheral area PA to the display area DA through a respective one of the plurality of third vias 800.

Figure 7:
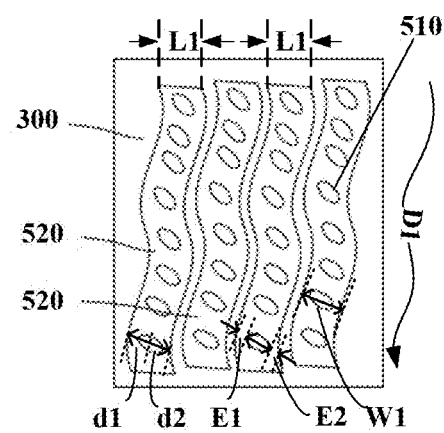
FIG. 7 is a schematic diagram illustrating a structure of a plurality of first signal lines in some embodiments according to the present disclosure.
Figure 9:
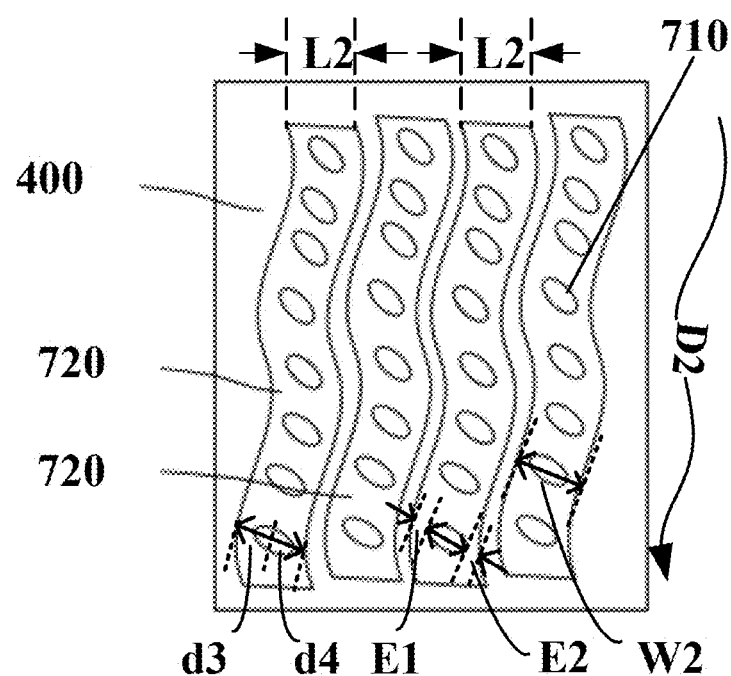
FIG. 9 is a schematic diagram illustrating a structure of a plurality of second signal lines in some embodiments according to the present disclosure.

FIG. 7 is a schematic diagram illustrating a structure of a plurality of first signal lines in some embodiments according to the present disclosure. FIG. 9 is a schematic diagram illustrating a structure of a plurality of second signal lines in some embodiments according to the present disclosure. Referring to FIG. 7 and FIG. 9, the respective one of the plurality of first signal lines 520 and the respective one of the plurality of second signal lines 720 have a curved configuration in plan view of the display substrate. Optionally, the curved configuration is an undulation configuration.

In some embodiments, the plurality of first signal lines 520 are parallel to each other. The plurality of second signal lines 720 are parallel to each other.

In some embodiments, referring to FIG. 7, a first width L1 of the respective one of the plurality of first signal lines 520 along a cross-section perpendicular to an extension direction (e.g. a first extension direction D1) of the respective one of the plurality of first signal lines 520 is substantially uniform.

As used herein, the term "substantially uniform" refers to, when widths of a signal line are measured along a plurality of cross-sections perpendicular to an extension direction of the signal line, the deviation between the average value of the measured widths along the plurality of cross-sections and each of the measured widths along the plurality of cross-sections is not exceeding 10% of the average value, e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the average value.

Figure 8:
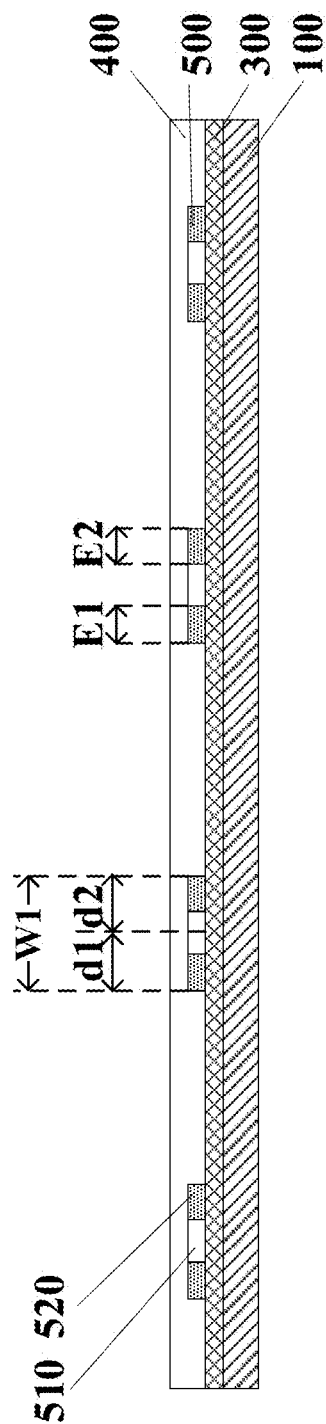
FIG. 8 is a cross-sectional view of a display substrate in some embodiments according to the present disclosure.

FIG. 8 is a cross-sectional view of a display substrate in some embodiments according to the present disclosure. In some embodiments, referring to FIG. 7 and FIG. 8, a first edge distance W1 between two opposite edges of the respective one of the plurality of first signal lines 520 along a cross-section perpendicular to an extension direction (e.g. a first extension direction D1) of the respective one of the plurality of first signal lines 520 is substantially uniform.

In some embodiments, a center point of a respective one of the plurality of first vias 510 extending through the respective one of the plurality of first signal lines 520 is substantially equidistant with respect to two opposite edges of the respective one of the plurality of first signal lines 520 across a width (e.g. first width L1) of the respective one of the plurality of first signal lines 520. For example, a first distance d1 between a center point of a respective one of the plurality of first vias 510 to one of the two opposite edges cross a width of the respective one of the plurality of first signal lines 520 and a second distance d2 between the center point of the respective one of the plurality of first vias 510 to another one of the two opposite edges cross the width of the respective one of the plurality of first signal lines 520 are substantially the same.

As used herein, the term "substantially equidistant" refers to a difference between two distances not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. In one example, a difference between the first distance d1 and the second distance d2 does not exceed 10% of the first distance d1. In another example, a difference between the third distance d3 and the fourth distance d4 does not exceed 10% of the third distance d3.

As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. In one example, a difference between the first distance d1 and the second distance d2 does not exceed 10% of the first distance d1. In another example, a difference between the third distance d3 and the fourth distance d4 does not exceed 10% of the third distance d3.

In some embodiments, in a respective one cross-section not only perpendicular to the first extension direction D1 of the respective one of the plurality first signal lines 520, but also having a center point of a respective one of the plurality of first vias 510, a fifth distance E1, across a first width L1 of the plurality of first signal lines 520 in the respective one cross-section and along a direction away from the center point, between an edge of the respective one of the plurality first vias 510 and an edge of the respective one of the plurality of first signal lines 520 and a sixth distance E2, across the first width L1 of the plurality of first signal lines 520 in the respective one cross-section and along the direction away from the center point, between another edge of the respective one of the plurality first vias 510 and another edge of the respective one of the plurality of first signal lines 520 are substantially the same.

In some embodiments, by forming a respective one of the plurality of first signal lines 520 in a curved configuration, e.g. undulation configuration, the adhesion between the first insulating layer 300 and the first signal line layer 500, and the adhesion between the second insulating layer 400 and the first signal line layer 500 are increased. So, it is difficult for the first signal line layer 500 to be separated from the first insulating layer 300, and be separated from the second insulating layer 400.

In some embodiments, referring to FIG. 7, a first, width L1 of the respective one of the plurality of first signal lines 520 along a cross-section perpendicular to an extension direction (e.g. a first extension direction D1) of the respective one of the plurality of first signal lines 520 is substantially uniform.

In some embodiments, referring to FIG. 9, a second width L2 of the respective one of the plurality of second signal lines 720 along a cross-section perpendicular to an extension direction (e.g. a second extension direction D2) of the respective one of the plurality of second signal lines 720 is substantially uniform.

Optionally, the first width L1 and the second width L2 are substantially the same.

Figure 10:
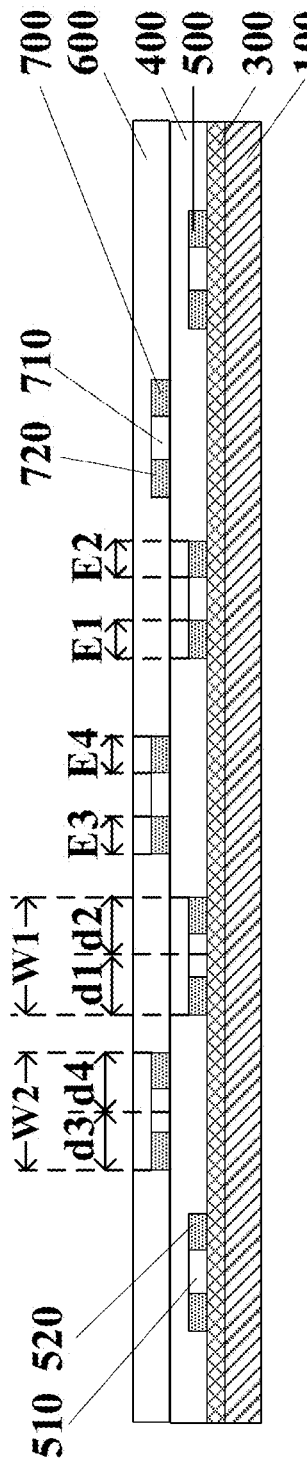
FIG. 10 is a cross-sectional view of a display substrate in some embodiments according to the present disclosure.

FIG. 10 is a cross-sectional view of a display substrate in some embodiments according to the present disclosure. In some embodiments, referring to FIG. 7 and FIG. 10, a first edge distance W1 between two opposite edges of the respective one of the plurality of first signal lines 520 along a cross-section perpendicular to an extension direction (e.g. a first extension direction D1) of the respective one of the plurality of first signal lines 520 is substantially uniform. Referring to FIG. 9 and FIG. 10, a second edge distance W2 between two opposite edges of the respective one of the plurality of second signal lines 720 along a cross-section perpendicular to an extension direction (e.g. a second extension direction D2) of the respective one of the plurality of second signal lines 720 is substantially uniform.

In some embodiments, referring to FIG. 7 and FIG. 10, a center point of a respective one of the plurality of first vias 510 extending through the respective one of the plurality of first signal lines 520 is substantially equidistant with respect to two opposite edges of the respective one of the plurality of first signal lines 520 across a width (e.g. first width L1) of the respective one of the plurality of first signal lines 520. For example, a first distance d1 between a center point of a respective one of the plurality of first vias 510 to one of the two opposite edges cross a width (e.g. first width L1) of the respective one of the plurality of first signal lines 520 and a second distance d2 between the center point of the respective one of the plurality of first vias 510 to another one of the two opposite edges cross the width of the respective one of the plurality of first signal lines 520 are substantially the same.

In some embodiments, referring to FIG. 9 and FIG. 10, a center point of a respective one of the plurality of second vias 710 extending through the respective one of the plurality of second signal lines 720 is substantially equidistant with respect to two opposite edges of the respective one of the plurality of second signal lines 720 across a width (e.g. second width L2) of the respective one of the plurality of second signal lines 720. For example, a third distance d3 between a center point of a respective one of the plurality of second vias 710 to one of the two opposite edges cross a width (e.g. second width L2) of the respective one of the plurality of second signal lines 720 and a fourth distance d4 between the center point of the respective one of the plurality of second vias 710 to another one of the two opposite edges cross the width (e.g. second width L2) of the respective one of the plurality of second signal lines 720 are the substantially same.

Optionally, the first distance d1, the second distance d2, the third distance d3, and the fourth distance d4 are substantially the same.

In some embodiments, referring to FIG. 7 and FIG. 10, in a respective one cross-section not only perpendicular to the first extension direction D1 of the respective one of the plurality first signal lines 520, but also having a center point of a respective one of the plurality of first vias 510, a fifth distance E1, across a first width L1 of the plurality of first signal lines 520 in the respective one cross-section and along a direction away from the center point, between an edge of the respective one of the plurality first vias 510 and an edge of the respective one of the plurality of first signal lines 520 and a sixth distance E2, across the first width L1 of the plurality of first signal lines 520 in the respective one cross-section and along the direction away from the center point, between another edge of the respective one of the plurality first vias 510 and another edge of the respective one of the plurality of first signal lines 520 are substantially the same.

In some embodiments, referring to FIG. 9 and FIG. 10, in a respective one cross-section not only perpendicular to the second extension direction D2 of the respective one of the plurality second signal lines 720, but also having a center point of a respective one of the plurality of second vias 710, a seventh distance E3, across a second width L2 of the plurality of second signal lines 720 in the respective one cross-section and along a direction away from the center point, between an edge of the respective one of the plurality second vias 710 and an edge of the respective one of the plurality of second signal lines 720 and a eighth distance E4, across the second width L2 of the plurality of second signal lines 720 in the respective one cross-section and along the direction away from the center point, between another edge of the respective one of the plurality second vias 710 and another edge of the respective one of the plurality of second signal lines 720 are substantially the same.

Optionally, the fifth distance E1, the sixth distance E2, the seventh distance E3, and the eighth distance E4 are substantially the same.

In some embodiments, by forming the plurality of first signal lines 520 and the plurality of second signal lines 720 in a curved configuration, e.g. undulation configuration, the adhesion between the first insulating layer 300 and the first signal line layer 500, and the adhesion between the second insulating layer 400 and the first signal line layer 500, the adhesion between the second insulating layer 400 and the second signal line layer 700, and the adhesion between the third insulating layer 600 and the second signal line layer 700 are increased. So, it is difficult for the first signal line layer 500 to be separated from the first insulating layer 300, and be separated from the second insulating layer 400. It is also difficult for the second signal line layer 700 to be separated from the second insulating layer 400, and be separated from the third insulating layer 600.

Figure 11:
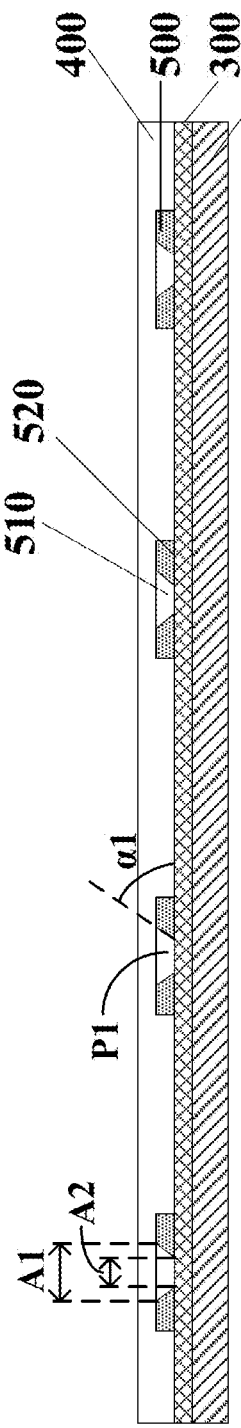
FIG. 11 is a partial cross-sectional view of a display substrate in some embodiments according to the present disclosure.

FIG. 11 is a partial cross-sectional view of a display substrate in some embodiments according to the present disclosure. Referring to FIG. 11, in some embodiments, a respective one of the plurality of first vias 510 has a first diameter A1 on a side away from the flexible base substrate 100 and a second diameter A2 on a side closer to the flexible base substrate 100. Optionally, the first diameter A1 is greater than the second diameter A2.

Optionally, the respective one of the plurality of first vias 510 has a truncated cone shape.

Optionally, a first included angle α1 between a lateral side of the respective one of the plurality of first vias 510 and the flexible base substrate 100 is in a range of 15 degrees to 85 degrees, e.g. 15 degrees to 35, 35 degrees to 55, 55 degrees to 75, 75 degrees to 85.

Optionally, a first portion P1 of the second insulating layer 400 extending into a respective one of the plurality of first vias 510 has a first diameter A1 on a side away from the flexible base substrate 100 and a second diameter A2 on a side closer to the flexible base substrate 100. Optionally, the first diameter A1 is greater than the second diameter A2. Optionally, a diameter of a cross section of the first portion P1 increases along a direction away from the flexible base substrate 100.

Optionally, the first portion P1 of the second insulating layer 400 extending into a respective one of the plurality of first vias 510 is in direct contact with the respective one of the plurality of first signal lines 520 along a lateral side of the respective one of the plurality of first vias 510.

Optionally, a first included angle α1 between a lateral side of the first portion P1 of the second insulating layer 400 and the flexible base substrate 100 is in a range of 15 degrees to 85 degrees. e.g. 15 degrees to 35, 35 degrees to 55, 55 degrees to 75, 75 degrees to 85.

Figure 12:
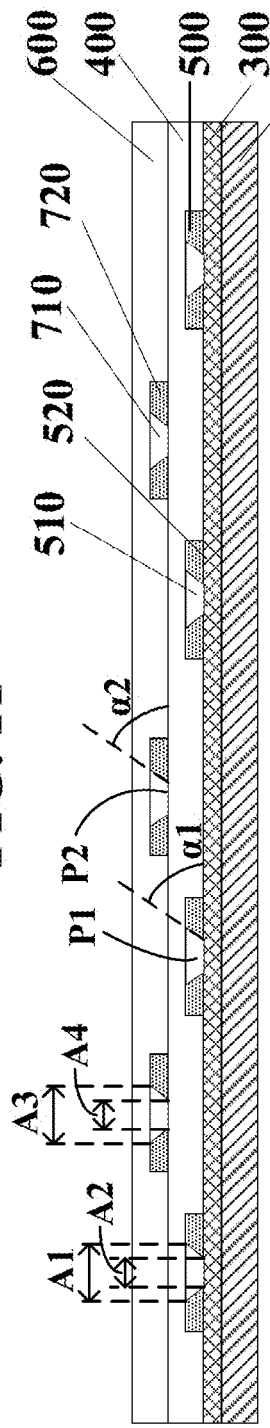
FIG. 12 is a partial cross-sectional view of a display substrate in some embodiments according to the present disclosure.

FIG. 12 is a partial cross-sectional view of a display substrate in some embodiments according to the present disclosure. Referring to FIG. 12, in some embodiments, a respective one of the plurality of first vias 510 has a first diameter A1 on a side away from the flexible base substrate 100 and a second diameter A2 on a side closer to the flexible base substrate 100. Optionally the first diameter A1 is greater than the second diameter A2. Optionally, the respective one of the plurality of second vias 710 further has a third diameter A3 on a side away from the flexible base substrate 100 and a fourth diameter A4 on a side closer to the flexible base substrate 100. Optionally, the third diameter A3 is greater than the fourth diameter A4.

Optionally, the respective one of the plurality of first vias 510 has a truncated cone shape. Optionally, the respective one of the plurality of second vias 710 has a truncated cone shape. Optionally, both the plurality of first vias 510 and the plurality of second vias 710 have truncated cone shapes.

Optionally, a first included angle α1 between a lateral side of the respective one of the plurality of first vias 510 and the flexible base substrate 100 is in a range of 15 degrees to 85 degrees, e.g. 15 degrees to 35, 35 degrees to 55, 55 degrees to 75, 75 degrees to 85. Optionally, a second included angle α2 between a lateral side of the respective one of the plurality of second vias 710 and the flexible base substrate 100 is in a range of 15 degrees to 85 degrees, e.g. 15 degrees to 35, 35 degrees to 55, 55 degrees to 75, 75 degrees to 85.

Optionally, a first portion P1 of the second insulating layer 400 extending into a respective one of the plurality of first vias 510 has a first diameter A1 on a side away from the flexible base substrate 100 and a second diameter A2 on a side closer to the flexible base substrate 100. Optionally, the first diameter A1 is greater than the second diameter A2. Optionally, a second portion P2 of the third insulating layer 600 extending into a respective one of the plurality of second vias 710 has a third diameter A3 on a side away from the flexible base substrate 100 and a fourth diameter A4 on a side closer to the flexible base substrate 100. Optionally, the third diameter A3 is greater than the fourth diameter A4. Optionally, a diameter of a cross section of the first portion P1 increases along a direction away from the flexible base substrate 100. Optionally, a diameter of a cross section of the second portion P2 increases along a direction away from the flexible base substrate 100.

Optionally, the first portion P1 of the second insulating layer 400 extending into a respective one of the plurality of first vias 510 is in direct contact with the respective one of the plurality of first signal lines 520 along a lateral side of the respective one of the plurality of first vias 510. Optionally, the second portion P2 of the third insulating layer 600 extending into a respective one of the plurality of second vias 710 is in direct contact with the respective one of the plurality of second signal lines 720 along a lateral side of the respective one of the plurality of second vias 710.

Optionally, a first included angle α1 between a lateral side of the first portion P1 of the second insulating layer 400 and the flexible base substrate 100 is in a range of 15 degrees to 85 degrees, e.g. 15 degrees to 35, 35 degrees to 55, 55 degrees to 75, 75 degrees to 85. Optionally, a second included angle α2 between a lateral side of the second portion P2 of the third insulating layer 600 and the flexible base substrate 100 is in a range of 15 degrees to 85 degrees, e.g. 15 degrees to 35, 35 degrees to 55, 55 degrees to 75, 75 degrees to 85.

In some embodiments, the bendable area BA can be bend to curve toward a direction away from the flexible base substrate 100. For example, a side of a respective one of the plurality of first vias 510 away from the flexible base substrate 100 is more strongly stretched than a side of the respective one of the plurality of first vias 510 closer to the flexible base substrate 100. A side of a respective one of the plurality of second vias 710 away from the flexible base substrate 100 is more strongly stretched than a side of the respective one of the plurality of second vias 710 closer to the flexible base substrate 100. By forming the truncated cone shape vias, the truncated cone shape adjust to the uneven stretch when the bendable area is bend, the separation between the insulating layers and the vias may be reduces, which can further increase the adhesion between the insulating layers and the vias.

In some embodiments, referring to FIG. 1 and FIG. 4, at least a portion of the peripheral area PA is a bendable area BA. The display substrate in the bendable area BA includes the flexible base substrate 100; the first insulating layer 300 on the flexible base substrate 100; the first signal line layer 500 including the plurality of first signal lines 520 on a side of the first insulating layer 300 away from the flexible base substrate 100; and the second insulating layer 400 on a side of the first signal line layer 500 away from the flexible base substrate 100. Optionally, the display substrate has a plurality of first vias 510 extending through a respective one of the plurality of first signal lines 520, exposing a first surface 310 of the first insulating layer 300. Optionally, the second insulating layer 400 extends through the plurality of first vias 510 to be in direct contact with the first surface 310 of the first insulating layer 300.

In another aspect, the present disclosure also provides a display panel including the display substrate described herein or fabricated by a method described herein. Optionally, the display panel is an organic light emitting diode display panel. Optionally, the display panel is a liquid crystal display panel.

In another aspect, the present disclosure also provides a display apparatus including the display substrate described herein or fabricated by a method described herein described herein, and one or more integrated circuits connected to the display substrate. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display substrate having a display area and a peripheral area. In some embodiments, the method includes, in the peripheral area, forming a first insulating layer on the flexible base substrate; forming a first signal line layer on a side of the first insulating layer away from the flexible base substrate, the first signal line layer formed to include a plurality of first signal lines; forming a plurality of first vias extending through a respective one of the plurality of first signal lines, exposing a first surface of the first insulating layer; and forming a second insulating layer on a side of the first signal line layer away from the flexible base substrate, the second insulating layer formed to extend through the plurality of first vias to be in direct contact with the first surface of the first insulating layer.

In some embodiments, the method further includes, in the peripheral area, forming a second signal line layer on a side of the second insulating layer away from the first insulating layer, the second signal line layer formed to include a plurality of second signal lines; forming a plurality of second vias extending through a respective one of the plurality of second signal lines, exposing a second surface of the second insulating layer; and forming a third insulating layer on a side of the second signal line layer away from the flexible base substrate, the third insulating layer formed to extend through the plurality of second vias to be in direct contact with the second surface of the second insulating layer.

Optionally, the plurality of first signal lines and the plurality of second signal lines are formed so that an orthographic projection of the respective one of the plurality of first signal lines on the flexible base substrate is substantially non-overlapping with orthographic projections of the plurality of second signal lines on the flexible base substrate; and an orthographic projection of the respective one of the plurality of second signal lines on the flexible base substrate is substantially non-overlapping with orthographic projections of the plurality of first signal lines on the flexible base substrate.

Optionally, the plurality of first signal lines and the plurality of second signal lines are formed so that orthographic projections of the plurality of first signal lines on the flexible base substrate and orthographic projections of the plurality of second signal lines on the flexible base substrate are alternately arranged.

In some embodiments, the plurality of first signal lines and the plurality of second signal lines are formed to extend along a direction from the display area to the peripheral area. Optionally, the respective one of the plurality of first signal lines and the respective one of the plurality of second signal lines have a curved configuration in plan view of the display substrate. Optionally, the curved configuration is an undulation configuration. Optionally, the plurality of first signal lines and the plurality of second signal lines are formed so that a first width of the respective one of the plurality of first signal lines along a cross-section perpendicular to an extension direction of the respective one of the plurality of first signal lines is substantially uniform; and a second width of the respective one of the plurality of second signal lines along a cross-section perpendicular to an extension direction of the respective one of the plurality of second signal lines is substantially uniform. Optionally, a center point of a respective one of the plurality of first vias extending through the respective one of the plurality of first signal lines is substantially equidistant with respect to two opposite edges of the respective one of the plurality of first signal lines across a width of the respective one of the plurality of first signal lines; and a center point of a respective one of the plurality of second vias extending through the respective one of the plurality of second signal lines is substantially equidistant with respect to two opposite edges of the respective one of the plurality of second signal lines across a width of the respective one of the plurality of second signal lines. Optionally, a respective one of the plurality of first vias has a first diameter on a side away from the flexible base substrate and a second diameter on a side closer to the flexible base substrate, the first diameter being greater than the second diameter; and a respective one of the plurality of second vias has a third diameter on a side away from the flexible base substrate and a fourth diameter on a side closer to the flexible base substrate, the third diameter being greater than the fourth diameter.

Optionally, the respective one of the plurality of first vias has a truncated cone shape, and the respective one of the plurality of second vias has a truncated cone shape. Optionally, a first included angle between a lateral side of the respective one of the plurality of first vias and the flexible base substrate is in a range of 15 degrees to 85 degrees; and a second included angle between a lateral side of the respective one of the plurality of second vias and the flexible base substrate is in a range of 15 degrees to 85 degrees.

Optionally, the second insulating layer is formed so that a first portion of the second insulating layer extending into a respective one of the plurality of first vias has a first diameter on a side away from the flexible base substrate and a second diameter on a side closer to the flexible base substrate, the first diameter being greater than the second diameter. Optionally, the second insulating layer is formed so that a first portion of the second insulating layer extending into a respective one of the plurality of first vias is in direct contact with the respective one of the plurality of first signal lines along a lateral side of the respective one of the plurality of first vias. Optionally, the third insulating layer is formed so that a second portion of the third insulating layer extending into a respective one of the plurality of second vias has a third diameter on a side away from the flexible base substrate and a fourth diameter on a side closer to the flexible base substrate, the third diameter being greater than the fourth diameter. Optionally, the third insulating layer is formed so that a second portion of the third insulating layer extending into a respective one of the plurality of second vias is in direct contact with the respective one of the plurality of second signal lines along a lateral side of the respective one of the plurality of second vias The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a display area and a peripheral area, wherein the display substrate in the peripheral area comprises:
    a flexible base substrate;
    a first insulating layer on the flexible base substrate;
    a first signal line layer comprising a plurality of first signal lines on a side of the first insulating layer away from the flexible base substrate;
    a second insulating layer on a side of the first signal line layer away from the flexible base substrate;
    a second signal line layer comprising a plurality of second signal lines on a side of the second insulating layer away from the first insulating layer; and
    a third insulating layer on a side of the second signal line layer away from the flexible base substrate;

wherein the display substrate has a plurality of first vias extending through a respective one of the plurality of first signal lines, exposing a first surface of the first insulating layer;

the display substrate has a plurality of second vias extending through a respective one of the plurality of second signal lines, exposing a second surface of the second insulating layer;

the second insulating layer extends through the plurality of first vias to be in direct contact with the first surface of the first insulating layer; and the third insulating layer extends through the plurality of second vias to be in direct contact with the second surface of the second insulating layer.

2. The display substrate of claim 1,
wherein an orthographic projection of the respective one of the plurality of first signal lines on the flexible base substrate is substantially non-overlapping with orthographic projections of the plurality of second signal lines on the flexible base substrate; and
an orthographic projection of the respective one of the plurality of second signal lines on the flexible base substrate is substantially non-overlapping with orthographic projections of the plurality of first signal lines on the flexible base substrate.

3. The display substrate of claim 2, wherein orthographic projections of the plurality of first signal lines on the flexible base substrate and orthographic projections of the plurality of second signal lines on the flexible base substrate are alternately arranged.

4. The display substrate of claim 1,
wherein the plurality of first signal lines and the plurality of second signal lines extend along a direction from the display area to the peripheral area.

5. The display substrate of claim 1,
wherein the respective one of the plurality of first signal lines and the respective one of the plurality of second signal lines have a curved configuration in plan view of the display substrate.

6. The display substrate of claim 5, wherein the curved configuration is an undulation configuration.

7. The display substrate of claim 1,
wherein a first width of the respective one of the plurality of first signal lines along a cross-section perpendicular to an extension direction of the respective one of the plurality of first signal lines is substantially uniform; and
a second width of the respective one of the plurality of second signal lines along a cross-section perpendicular to an extension direction of the respective one of the plurality of second signal lines is substantially uniform.

8. The display substrate of claim 1,
wherein a center point of a respective one of the plurality of first vias extending through the respective one of the plurality of first signal lines is substantially equidistant with respect to two opposite edges of the respective one of the plurality of first signal lines across a width of the respective one of the plurality of first signal lines; and
a center point of a respective one of the plurality of second vias extending through the respective one of the plurality of second signal lines is substantially equidistant with respect to two opposite edges of the respective one of the plurality of second signal lines across a width of the respective one of the plurality of second signal lines.

9. The display substrate of claim 1,
wherein a respective one of the plurality of first vias has a first diameter on a side away from the flexible base substrate and a second diameter on a side closer to the flexible base substrate, the first diameter being greater than the second diameter; and
a respective one of the plurality of second vias has a third diameter on a side away from the flexible base substrate and a fourth diameter on a side closer to the flexible base substrate, the third diameter being greater than the fourth diameter.

10. The display substrate of claim 9, wherein the respective one of the plurality of first vias has a truncated cone shape, and the respective one of the plurality of second vias has a truncated cone shape.

11. The display substrate of claim 10, wherein a first included angle between a lateral side of the respective one of the plurality of first vias and the flexible base substrate is in a range of 15 degrees to 85 degrees; and
a second included angle between a lateral side of the respective one of the plurality of second vias and the flexible base substrate is in a range of 15 degrees to 85 degrees.

12. The display substrate of claim 1,
wherein a first portion of the second insulating layer extending into a respective one of the plurality of first vias has a first diameter on a side away from the flexible base substrate and a second diameter on a side closer to the flexible base substrate, the first diameter being greater than the second diameter; and
a second portion of the third insulating layer extending into a respective one of the plurality of second vias has a third diameter on a side away from the flexible base substrate and a fourth diameter on a side closer to the flexible base substrate, the third diameter being greater than the fourth diameter.

13. The display substrate of claim 1,
wherein a first portion of the second insulating layer extending into a respective one of the plurality of first vias is in direct contact with the respective one of the plurality of first signal lines along a lateral side of the respective one of the plurality of first vias; and
a second portion of the third insulating layer extending into a respective one of the plurality of second vias is in direct contact with the respective one of the plurality of second signal lines along a lateral side of the respective one of the plurality of second vias.

14. The display substrate of claim 1, further comprising a plurality of thin film transistors in the display area for driving image display of the display substrate;
wherein the peripheral area comprises a fan-out area;
at least a portion of the peripheral area being a bendable area; and
the bendable area is within the fan-out area.

15. The display substrate of claim 14, wherein the fan-out area is between the display area and a bonding area for bonding a connection terminal.

16. The display substrate of claim 1, wherein at least a portion of the peripheral area being a bendable area; and
the display substrate in the bendable area comprises:
the flexible base substrate;
the first insulating layer on the flexible base substrate;
the first signal line layer comprising the plurality of first signal lines on a side of the first insulating layer away from the flexible base substrate; and
the second insulating layer on a side of the first signal line layer away from the flexible base substrate;

wherein the display substrate has a plurality of first vias extending through a respective one of the plurality of first signal lines, exposing a first surface of the first insulating layer; and the second insulating layer extends through the plurality of first vias to be in direct contact with the first surface of the first insulating layer.

17. A display apparatus, comprising the display substrate of claim 1.

18. A method of fabricating a display substrate having a display area and a peripheral area, comprising, in the peripheral area:

forming a first insulating layer on a flexible base substrate;

forming a first signal line layer on a side of the first insulating layer away from the flexible base substrate, the first signal line layer formed to comprise a plurality of first signal lines;

forming a plurality of first vias extending through a respective one of the plurality of first signal lines, exposing a first surface of the first insulating layer;

forming a second insulating layer on a side of the first signal line layer away from the flexible base substrate, the second insulating layer formed to extend through the plurality of first vias to be in direct contact with the first surface of the first insulating layer forming a second signal line layer on a side of the second insulating layer away from the first insulating layer, the second signal line layer formed to comprise a plurality of second signal lines;

forming a plurality of second vias extending through a respective one of the plurality of second signal lines, exposing a second surface of the second insulating layer; and forming a third insulating layer on a side of the second signal line layer away from the flexible base substrate, the third insulating layer formed to extend through the plurality of second vias to be in direct contact with the second surface of the second insulating layer.

* * * * *